(12) United States Patent
Onodera et al.

(10) Patent No.: US 8,731,698 B2
(45) Date of Patent: May 20, 2014

(54) SUBSTRATE RECEIVING METHOD AND CONTROLLER

(75) Inventors: Shinobu Onodera, Yamanashi (JP); Masahiro Numakura, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 1066 days.

(21) Appl. No.: 12/762,426

(22) Filed: Apr. 19, 2010

(65) Prior Publication Data
US 2010/0268364 A1 Oct. 21, 2010

Related U.S. Application Data

(60) Provisional application No. 61/242,604, filed on Sep. 15, 2009.

(30) Foreign Application Priority Data

Apr. 20, 2009 (JP) .................................. 2009-102106

(51) Int. Cl.
 *G06F 17/00* (2006.01)

(52) U.S. Cl.
 USPC ............ 700/100; 700/112; 700/121; 700/242

(58) Field of Classification Search
 CPC .................. H01L 21/67196; H01L 31/67778; H01L 21/67069
 USPC ................................ 700/100, 112, 121, 242
 See application file for complete search history.

(56) References Cited

U.S. PATENT DOCUMENTS

| | | | |
|---|---|---|---|
| 5,248,886 A * | 9/1993 | Asakawa et al. ......... | 250/442.11 |
| 6,235,634 B1 * | 5/2001 | White et al. .................. | 438/680 |
| 6,450,750 B1 * | 9/2002 | Heyder et al. ................ | 414/217 |
| 6,612,797 B1 * | 9/2003 | Bonora et al. ................ | 414/217 |
| 7,379,785 B2 * | 5/2008 | Higashi et al. ................ | 700/112 |
| 7,406,360 B2 * | 7/2008 | Machiyama .................. | 700/112 |
| 7,416,405 B2 * | 8/2008 | Asari et al. ..................... | 432/239 |
| 7,523,769 B2 | 4/2009 | Miyajima et al. | |
| 7,575,382 B2 * | 8/2009 | Kaneko et al. ................ | 396/611 |
| 7,901,149 B2 * | 3/2011 | Yamada et al. ............... | 396/611 |
| 8,145,339 B2 * | 3/2012 | Iijima et al. ................... | 700/112 |
| 8,292,563 B2 * | 10/2012 | Haris ............................. | 414/217 |
| 8,315,730 B2 * | 11/2012 | Jones et al. ................... | 700/121 |

(Continued)

FOREIGN PATENT DOCUMENTS

| | | | |
|---|---|---|---|
| JP | 2006-128153 A | 5/2006 | |
| JP | 2006-351619 A | 12/2006 | |

(Continued)

*Primary Examiner* — Kavita Padmanabhan
*Assistant Examiner* — Olvin Lopez Alvarez
(74) *Attorney, Agent, or Firm* — Pearne & Gordon LLP (57) ABSTRACT

A substrate receiving method in a substrate processing system includes: a processing process of transferring a plurality of unprocessed substrates accommodated in a first substrate storage container to a substrate processing chamber in sequence and performing a plasma process on the unprocessed substrates in the substrate processing chamber; a retreating process of retreating the plasma-processed substrates temporarily to a second substrate storage container by transferring the plasma-processed substrates to the second substrate storage container in sequence; a determining process of determining whether or not the last unprocessed substrate is unloaded from the first substrate storage container; and a re-accommodating process of transferring and re-accommodating the plurality of the processed substrates accommodated in the second substrate storage container into the first substrate storage container in sequence when a substrate decided as the last unprocessed substrate is unloaded in the determining process.

10 Claims, 5 Drawing Sheets

(56) References Cited

U.S. PATENT DOCUMENTS

| | | | |
|---|---|---|---|
| 8,377,501 B2 * | 2/2013 | Hayashida et al. | 427/8 |
| 2002/0077714 A1 * | 6/2002 | Takeuchi | 700/95 |
| 2002/0150448 A1 * | 10/2002 | Mizokawa et al. | 414/217 |
| 2003/0063972 A1 * | 4/2003 | Liou | 414/806 |
| 2004/0062627 A1 * | 4/2004 | Aggarwal et al. | 414/217 |
| 2005/0049737 A1 * | 3/2005 | Lin et al. | 700/110 |
| 2005/0071043 A1 * | 3/2005 | Jevtic et al. | 700/213 |
| 2006/0219171 A1 * | 10/2006 | Sasaki et al. | 118/719 |
| 2008/0167747 A1 * | 7/2008 | Nakamura | 700/112 |
| 2009/0022574 A1 * | 1/2009 | Eudy et al. | 414/589 |

FOREIGN PATENT DOCUMENTS

| | | | | |
|---|---|---|---|---|
| JP | 2008-235920 | * | 10/2008 | H01L 21/677 |
| JP | 2008-235920 A | | 10/2008 | |
| WO | WO 2008032714 | * | 3/2008 | C23C 16/52 |

\* cited by examiner

LOT START IS NOT ALLOWED

■ : LP BEFORE LOT START

FIG. 3B

LOT START IS NOT ALLOWED

□ : LP UNDER LOT PROCESS
■ : LP BEFORE LOT START

SUBSTRATE RECEIVING METHOD AND CONTROLLER

CROSS-REFERENCE TO RELATED APPLICATION

This application claims the benefit of Japanese Patent Application No. 2009-102106 filed on Apr. 20, 2009, and U.S. Provisional Patent Application Ser. No. 61/242,604 filed on Sep. 15, 2009, the entire disclosures of which are incorporated herein by reference.

FIELD OF THE INVENTION

The present disclosure relates to a substrate receiving method and to a controller for controlling a substrate processing system.

BACKGROUND OF THE INVENTION

In a substrate processing system, an atmospheric transfer chamber is provided between a storage container for receiving a wafer and a substrate processing chamber maintained at a preset vacuum state so as to connect the storage container with the substrate processing chamber. Further, a wafer is held by an arm or the like and transferred between the substrate processing chamber and the storage container. An unprocessed wafer in the storage container is transferred to the substrate processing chamber and a plasma process is performed thereon, and then the wafer as a processed wafer is accommodated again in the storage container. In the substrate processing chamber, for example, a reactive ion etching (RIE) process may be performed as a preset plasma process. The storage container is called "FOUP," "carrier" or the like.

The processed wafer re-accommodated in the FOUP can be contaminated due to atmosphere within the FOUP (secondary contamination), resulting in a decrease in production yield of the processed wafer. According to a mechanism of the secondary contamination, an atmosphere gas (e.g., halogen-based residual gas), a halogen-based reaction product and the like (hereinafter, simply referred to as "foreign materials") within the substrate processing chamber are adhered to a surface of the RIE-processed wafer and these foreign materials are introduced into the FOUP together with the wafer. Here, even if a small amount of the foreign materials is adhered to each processed wafer, a plurality of wafers is loaded into the FOUP which is a closed and narrow space, and, thus, the inside of the FOUP can be contaminated by the foreign materials. Therefore, an unprocessed wafer or a processed wafer can be secondarily contaminated.

In Patent Document 1 regarding a technique of cleaning the inside of the FOUP, a gas supply pipe is provided above an opening in a so-called FIMS (Front-Opening Interface Mechanical Standard) and a cleaning gas is blown from the pipe toward an upper surface of a wafer accommodated in the FOUP in order to remove contaminants from the wafer in the FOUP.

It is disclosed in Patent Document 2 that there is installed an air substitution mechanism which substitutes a clean gas for a gas within a FOUP in order to maintain the inside of the FOUP accommodating wafers at a desired gas atmosphere.

Patent Document 1: Japanese Patent Laid-open Publication No. 2006-128153

Patent Document 2: Japanese Patent Laid-open Publication No. 2006-351619

BRIEF SUMMARY OF THE INVENTION

However, when an etching process is performed by a halogen-based reaction gas for each FOUP accommodating a plurality of unprocessed wafers, according to a conventional process sequence, etching processes are performed on wafers taken out from the FOUP in sequence and then the processed wafers are taken back to their original FOUP.

According to this process sequence, even if the techniques for cleaning the inside of the FOUP as disclosed in the above-described Patent Documents are used, an unprocessed wafer and a processed wafer may exist in the same FOUP for a certain time until all wafers in the FOUP are completely plasma-processed. Therefore, the above-described Patent Documents cannot completely solve the problem of contamination within the FOUP and cannot greatly suppress a decrease in production yield.

Further, in accordance with the above-described Patent Documents, new equipment is required, resulting in an increase in manufacturing cost and complication of maintenance. Therefore, it is demanded to provide a receiving method capable of avoiding contamination of a processed wafer without new equipment.

In view of the foregoing, the present disclosure provides a substrate receiving method capable of avoiding co-existence of an unprocessed wafer with a processed wafer and a controller for controlling such a method.

In accordance with one aspect of the present invention, there is provided a substrate receiving method in a substrate processing system including a substrate processing chamber in which a plasma process is performed on a substrate at a preset vacuum state; a first and a second substrate storage container configured to accommodate the substrate; and an atmospheric transfer chamber which connects the substrate processing chamber and the first and the second substrate storage container. The method includes: a processing process of transferring a plurality of unprocessed substrates accommodated in the first substrate storage container to the substrate processing chamber in sequence and performing a plasma process on the unprocessed substrates in the substrate processing chamber; a retreating process of retreating the plasma-processed substrates temporarily to the second substrate storage container by transferring the plasma-processed substrates to the second substrate storage container in sequence; a determining process of determining whether or not the last unprocessed substrate is unloaded from the first substrate storage container; and a re-accommodating process of transferring and re-accommodating the plurality of the processed substrates accommodated in the second substrate storage container into the first substrate storage container in sequence when a substrate decided as the last unprocessed substrate is unloaded in the determining process.

According to the above, in the substrate processing system, the second substrate storage container serving as a buffer for temporarily receiving the substrate is provided in addition to the first substrate storage container. Moreover, according to the substrate receiving method of this substrate processing system, if the last unprocessed substrate is unloaded from the first substrate storage container, the plurality of the processed substrates received in the second substrate storage container are transferred to the first substrate storage container in sequence and re-accommodated therein.

Therefore, the unprocessed substrate and the processed substrate are completely isolated from each other and transferred in sequence, and, thus, it is possible to avoid co-existence thereof in the first substrate storage container. Accordingly, it is possible to prevent a decrease in production yield caused by contamination within the first substrate storage container.

Further, the substrate receiving method may further include an availability determining process of determining whether or not it is possible to load all the unprocessed substrates accommodated in the first substrate storage container into the second substrate storage container based on an available state of the second substrate storage container. Moreover, if it is determined in the availability determining process that it is possible to load the unprocessed substrates into the second substrate storage container, the processing process may be performed.

In the availability determining process of the substrate receiving method, it may be determined whether or not all product substrates among the plurality of the unprocessed substrates accommodated in the first substrate storage container can be loaded into the second substrate storage container.

Further, in the availability determining process of the substrate receiving method, if the number of the unprocessed substrates accommodated in the first substrate storage container is equal to or smaller than the number of the processed substrates which can be loaded into the second substrate storage container, it may be determined that all the unprocessed substrates can be loaded into the second substrate storage container.

Furthermore, in the determining process of the substrate receiving method, it may be determined that the last unprocessed substrate is unloaded, based on information of the last unprocessed substrate accommodated in the first substrate storage container for each lot or information of a lot process stop.

In the substrate receiving method, if a dummy substrate is transferred to the substrate processing chamber, the dummy substrate may be returned to the original storage container without being retreated temporarily to the second substrate storage container in the retreating process after the processing process.

In the substrate receiving method, if the first substrate storage container includes a plurality of first substrate storage units and the second substrate storage container includes a plurality of second substrate storage units and the number of the first substrate storage units is greater than the number of the second substrate storage units, until the last unprocessed substrate accommodated in any one of the first substrate storage units is unloaded after the processes on unprocessed substrates accommodated in the first substrate storage units in the same number as the second substrate storage units are started, unprocessed substrates accommodated in the remaining first substrate storage unit, on which the processing process is not performed, may be set to be in a standby state.

In the determining process of the substrate receiving method, when the last unprocessed substrate in any one of the first substrate storage units is decided, the standby state of the unprocessed substrates accommodated in the remaining first substrate accommodation unit, on which the processing process is not performed, may be cancelled and the processing process may be performed thereon.

Furthermore, in accordance with another aspect of the present invention, there is provided a controller for controlling a substrate processing system. The substrate processing system includes: a substrate processing chamber in which a plasma process is performed on a substrate at a preset vacuum state; a first and a second substrate storage container which accommodates the substrate; and an atmospheric transfer chamber which connects the substrate processing chamber and the first and the second substrate storage container. Moreover, the controller is configured to perform a control of: transferring a plurality of unprocessed substrates accommodated in the first substrate storage container to the substrate processing chamber in sequence and performing a plasma process on the unprocessed substrates in the substrate processing chamber; retreating the plasma-processed substrates temporarily to the second substrate storage container by transferring the plasma-processed substrates to the second substrate storage container in sequence; determining whether or not the last unprocessed substrate is unloaded from the first substrate storage container; and transferring and re-accommodating the plurality of the processed substrates accommodated in the second substrate storage container into the first substrate storage container in sequence when a substrate decided as the last unprocessed substrate is unloaded as a result of the determining.

As described above, in accordance with the present disclosure, a decrease in production yield may be suppressed by avoiding co-existence of an unprocessed wafer with a processed wafer.

BRIEF DESCRIPTION OF THE DRAWINGS

The disclosure may best be understood by reference to the following description taken in conjunction with the following figures.

DETAILED DESCRIPTION OF THE INVENTION

Hereinafter, embodiments of the present invention will be described in detail with reference to the accompanying drawings. In this specification and drawings, same parts having substantially same function and configuration will be assigned same reference numerals and redundant description thereof will be omitted.

Figure 1:
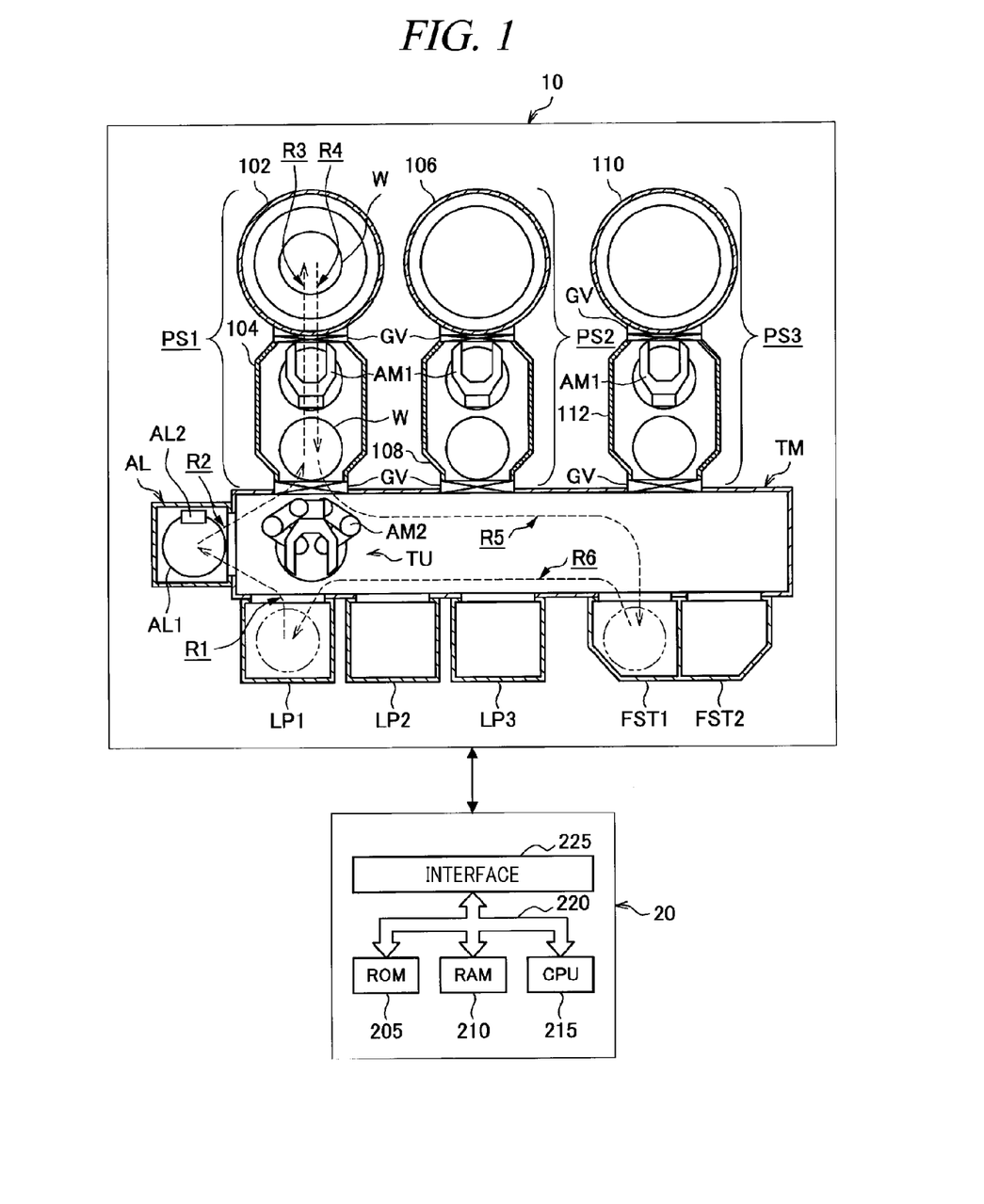
FIG. 1 is a view of a substrate processing system and a controller in accordance with an embodiment of the present invention.

There will be explained a hardware configuration of a substrate processing system 10 and a controller 20 in accordance with an embodiment of the present invention with reference to FIG. 1.

[Hardware Configuration of Substrate Processing System]

A substrate processing system 10 includes a first process ship PS1, a second process ship PS2, a third process ship PS3, an atmospheric transfer chamber (transfer module) TM, a position alignment mechanism AL, FOUPs LP1 to LP3 serving as a first substrate storage container, and front storages FST1 and FST2 serving as a second substrate storage container.

The first process ship PS1 includes a substrate processing chamber 102 and a load-lock chamber 104. In the substrate processing chamber 102, a plasma process is performed on a wafer W at a preset vacuum state. The load-lock chamber 104 is provided between the atmospheric transfer chamber TM and the substrate processing chamber 102 such that the wafer W is held by an arm AM1 at a preset depressurized state and transferred between an atmospheric space and a vacuum space. To be specific, the arm AM1 waits in the load-lock chamber 104 while holding a next wafer W to be processed. When a previous wafer W is plasma-processed, the arm AM1 transfers the next wafer W as a replacement for the previous wafer W into the substrate processing chamber 102 and also transfers the previous wafer W into the atmospheric transfer chamber TM. A gate valve GV is provided at each connection portion between the chambers so as to airtightly seal the chambers. In the same manner, the second process ship PS2 and the third process ship PS3 also include a substrate processing chamber 106 and a load-lock chamber 108, and a substrate processing chamber 110 and a load-lock chamber 112, respectively. Further, a gate valve GV is provided at each connection portion between the chambers.

In the substrate processing chambers 102, 106, and 110, a reactive ion etching (RIE) process is performed on the wafer W by plasma, or a chemical oxide removal (COR) process and a post heat treatment (PHT) are performed on the RIE-processed wafer. Further, a plasma process such as a film forming process, a sputtering process or the like may be performed thereon.

The atmospheric transfer chamber TM connects the FOUPs LP1 to LP3 and the front storages FST1 and FST2 with the substrate processing chambers 102, 106, and 110 via the load-lock chambers 104, 108, and 112. Provided within the atmospheric transfer chamber TM is a substrate transfer unit TU including an arm AM2, a non-illustrated rail or the like. The substrate transfer unit TU transfers the wafer W between the load-lock chambers 104, 108, and 112 and the FOUPs LP1 to LP3 or the front storages FST1 and FST2. Further, the substrate transfer unit TU transfers the wafer W between the substrate processing chambers 102, 106, and 110 and the FOUPs LP1 to LP3 and between the substrate processing chambers 102, 106, and 110 and the front storages FST1 and FST2 via the load-lock chambers 104, 108, and 112.

The position alignment mechanism AL is configured to align a position of the wafer W by detecting a status of a peripheral portion of the wafer W by an optical sensor AL2 while rotating a rotatable table AL1 which mounts thereon the wafer W.

The FOUPs LP1 to LP3 and the front storages FST1 and FST2 are mounted on a non-illustrated cassette stage provided at a side wall of the atmospheric transfer chamber TM. Each of the FOUPs LP1 to LP3 and the front storages FST1 and FST2 can store, for example, maximum 25 sheets of wafers W at multiple levels. The front storages FST1 and FST2 include a device for evacuating a residual gas generated from a processed wafer.

[Hardware Configuration of Controller]

Hereinafter, there will be explained a hardware configuration of a controller 20. The controller 20 includes a ROM 205, a RAM 210, a CPU 215, a bus 220 and an interface 225.

The ROM 205 stores therein a basic program to be executed in the controller 20, a program to be executed in case of fault detection or the like. The RAM 210 stores therein various programs, recipes, parameters or the like. In a recipe used for an etching process, a sequence of performing an etching process on a product wafer (an example of a product substrate) or a dummy wafer (an example of a dummy substrate), or its process condition (e.g., a set temperature) are defined.

The RAM 210 also stores therein a lot number of each wafer accommodated in the FOUPs LP1 to LP3, a wafer number or empty information of the front storages FST1 and FST2. The RAM 210 stores information of which wafer is the last wafer for each lot. The ROM 205 and the RAM 210 are just an example of a memory, and, thus, other memory such as an EEPROM, an optical disc, a magneto-optical disc, a hard disc and the like may be used.

The CPU 215 controls a plasma process or a transfer of the product wafer. Further, the CPU 215 manages a state of a wafer W in each FOUP or each front storage and controls a timing of loading or unloading the wafer W to or from each FOUP or each front storage if necessary, thereby preventing co-existence of an unprocessed wafer with a processed wafer in each FOUP.

Figure 4A:
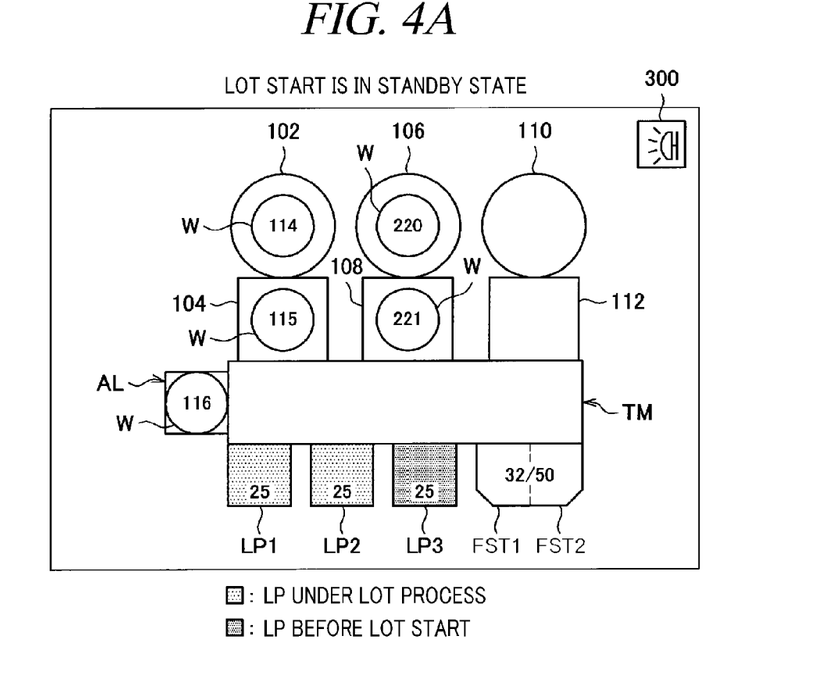
FIGS. 4A and 4B show other examples of a transfer state of a wafer in accordance with an embodiment.

The bus 220 is a path for exchanging information between the respective devices. The interface 225 receives parameters through a non-illustrated input device such as a keyboard by manipulation of an operator, and outputs necessary information through a non-illustrated monitor or speaker. For example, as described below, if a lot start is not allowed but in a standby state, a symbol 300 indicative of a standby state of the lot start is displayed on the monitor via the interface 225 as depicted in FIG. 4A. Further, the interface 225 receives and transmits data required for driving each actuator of the substrate processing system 10.

The operator may select a transfer method using the front storages FST1 and FST2 or a transfer method not using the front storages FST1 and FST2 by pre-setting a parameter. Hereinafter, in order to explain an operation of the controller 20, it is assumed that the operator selects the transfer method using the front storages FST1 and FST2.

Further, the dummy wafer (non-product wafer used for a cleaning process or a seasoning process) unloaded from a dummy storage (not illustrated) is supposed to be directly accommodated in its original FOUP without using the front storages FST1 and FST2 regardless of the parameters.

[Transfer Route]

There will be explained a basic transfer route of the wafer. FIG. 1 shows an example of a transfer route of a wafer (unprocessed wafer) accommodated in the FOUP LP1. The wafer W is unloaded from the FOUP LP1 and transferred to the position alignment mechanism AL by the arm AM2 so as to be position-aligned (Route R1). Thereafter, the wafer W is received from the arm AM2 and held by the arm AM1 in the load-lock chamber 104 while waiting for completion of a RIE process of the previous wafer (Route R2).

When the RIE process of the previous wafer is completed, the previous wafer is unloaded from the substrate processing chamber 102 and the wafer W is loaded into the substrate processing chamber 102 (Route R3). After the RIE process of the wafer W in the substrate processing chamber 102, the processed wafer W passes through the load-lock chamber 104 (Route R4) and is loaded into the front storage FST1 via the atmospheric transfer chamber TM (Route R5). The processed wafer W accommodated in the front storage FST1 is re-accommodated in its original FOUP LP1 at a preset timing (Route R6).

[Operations of Controller]

Figure 2A:
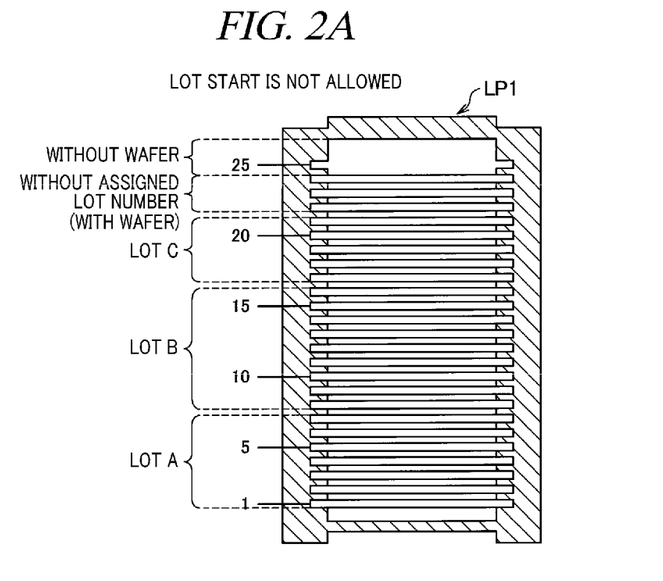
FIGS. 2A and 2B are views of wafers accommodated in FOUP in accordance with an embodiment.

Hereinafter, operations of the controller 20 will be explained with reference to FIGS. 2 to 4. The detailed explanation will be stated in the following sequence: 1) checking operation prior to a lot process, 2) determination operation of an accommodation availability, 3) unloading operation and processing operation, 4) retreat operation, 5) determination operation, and 6) re-accommodation operation.

(1) Checking Operation Prior to Lot Process

First of all, the controller 20 checks an accommodation state of the wafer prior to a lot process. For example, in FIG. 2A, slots (slot numbers 1 to 7) within the FOUP LP1 accommodate therein 7 sheets of unprocessed wafers W (wafer numbers 1 to 7) belonging to a lot number A. Slots (slot numbers 8 to 16) store 9 sheets of unprocessed wafers W (wafer numbers 8 to 16) belonging to a lot number B. Slots (slot numbers 17 to 21) accommodate therein 5 sheets of unprocessed wafers W (wafer numbers 17 to 21) belonging to a lot number C. Slots (slot numbers 22 to 24) store therein 3 sheets of unprocessed wafers W to which a lot number is not assigned. A slot (a slot number 25) does not accommodate any wafer W.

If the controller 20 allows a lot start in this state, the wafers W in the slot numbers 1 to 21 are processed and the wafers in the slot numbers 22 to 24 are not processed. As for the wafers to which a lot number is not assigned, the lot process is not started, and, thus, a plasma process is not performed on such wafers in the substrate processing chamber. Accordingly, the unprocessed wafers and the processed wafers co-exist in the FOUP LP1. In order to avoid this problem, if the wafer W without assignment of a lot number is accommodated in the FOUP, the controller 20 does not allow the lot process to be started in the FOUP LP1 until the lot number is assigned or a transfer method without using the front storages FST1 and FST2 is selected.

Figure 2B:
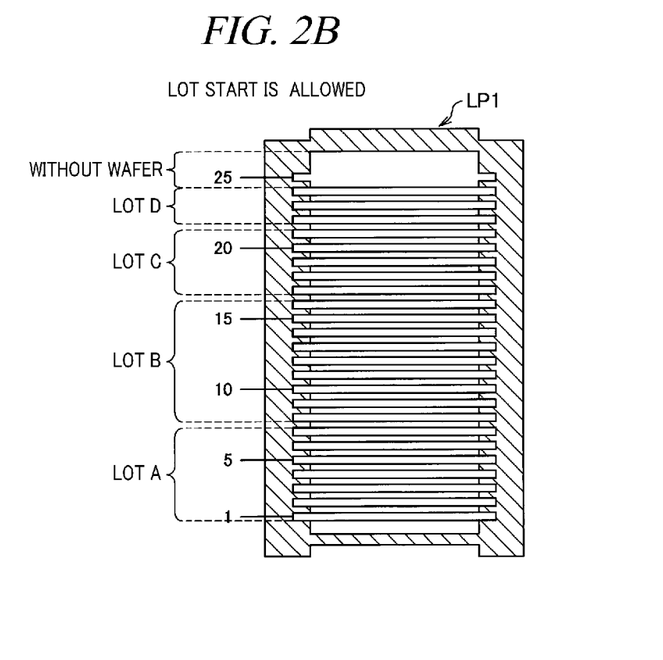

Meanwhile, as depicted in FIG. 2B, 7 sheets of unprocessed wafers W (wafer numbers 1 to 7) belonging to a lot number A, 9 sheets of unprocessed wafers W (wafer numbers 8 to 16) belonging to a lot number B, 5 sheets of unprocessed wafers W (wafer numbers 17 to 21) belonging to a lot number C, and 3 sheets of unprocessed wafers W (wafer numbers 22 to 24) belonging to a lot number D are accommodated in the FOUP LP1.

If all the wafers in the FOUP are assigned with a lot number as described above, all the processed wafers are re-accommodated in the FOUP LP1 after the plasma process is normally completed on all the wafers W. Therefore, the unprocessed wafers and the processed wafers do not co-exist in the FOUP LP1. Even if the slot (the slot number 25) is an empty slot, the co-existence state does not occur. Therefore, in this case, the controller 20 allows the lot process in the FOUP LP1 to start and completes the checking operation prior to the lot process and then progresses to the next determination operation of an accommodation availability.

(2) Determination Operation of an Accommodation Availability

In this operation, based on an available state of the front storage FST1 and the front storage FST2, the controller 20 determines whether or not it is possible to store all unprocessed wafers accommodated in the FOUP LP1 into the front storage FST1 or the front storage FST2 (Determination step of an accommodation availability).

To be specific, the controller 20 determines whether or not all product wafers among the unprocessed wafers accommodated in the FOUP LP1 can be stored in the front storages FST1 and FST2.

To be more specific, if the number of the unprocessed wafers accommodated in the FOUP LP1 is equal to or smaller than the number of the processed wafers which can be stored in the front storages FST1 and FST2, the controller 20 determines that all the unprocessed wafers can be stored in the front storages FST1 and FST2.

Figure 3A:
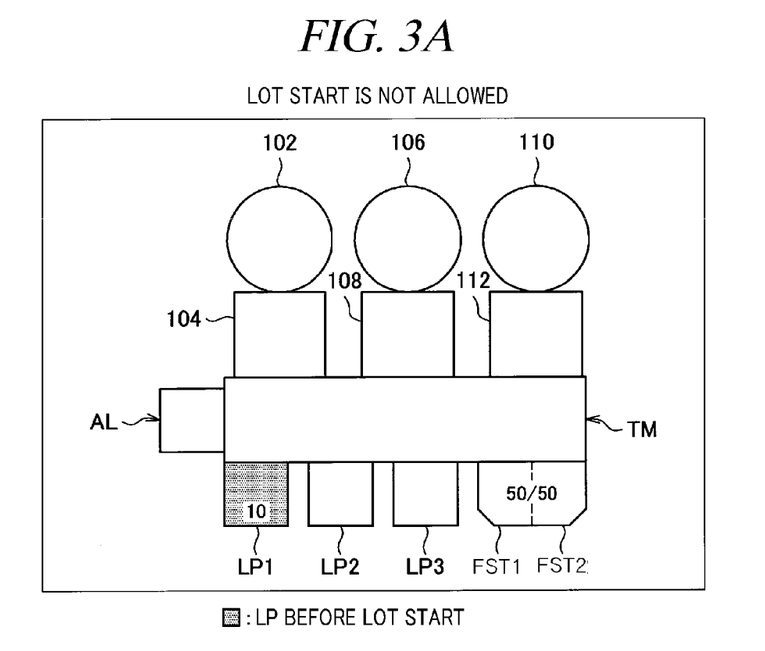
FIGS. 3A and 3B show examples of a transfer state of a wafer in accordance with an embodiment.

For example, referring to FIG. 3A, in order to perform a plasma process on 10 sheets of unprocessed wafers W along a transfer route passing through the FOUP LP1→the substrate processing chamber 102→the front storage FST1 or the front storage FST2→the FOUP LP1, the controller 20 checks if the front storages FST1 and FST2 are in an available state. In FIG. 3A, the fraction "50/50" is displayed on the front storages FST1 and FST2. The denominator in this fraction is indicative of the total number of wafers which can be accommodated in the front storages FST1 and FST2, and the numerator is indicative of the number of wafers being accommodated in the front storages FST1 and FST2 at this time. In case of "50/50," the maximum number of wafers is accommodated in the front storages FST1 and FST2, and, thus, no more wafers can be accommodated and there is no available slot in the front storages FST1 and FST2. Therefore, the controller 20 determines that it is impossible to store the wafers in the front storages, i.e., it is impossible to start the lot process in the FOUP LP1.

Figure 3B:
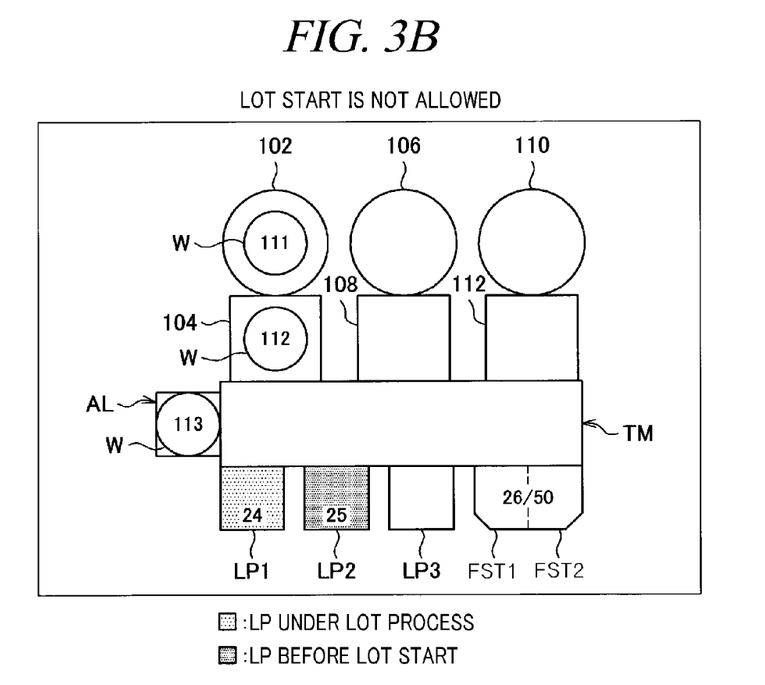

In FIG. 3B, a process on 24 sheets of unprocessed wafers W has already been started along a transfer route passing through the FOUP LP1→the substrate processing chamber 102→the front storages FST1 and FST2→the FOUP LP1. Here, 13 sheets of wafers have already been unloaded from the FOUP LP1, and the 11th wafer is being plasma-processed, the 12th wafer is in a standby state in the load-lock chamber 104, and the 13th wafer is being aligned.

In this state, in order to perform plasma processes on 25 sheets of unprocessed wafers W along a transfer path passing through the FOUP LP2→the substrate processing chamber 106→the front storages FST1 and FST2→the FOUP LP2, the controller 20 checks if the front storages FST1 and FST2 are in an available state. In this case, there are 26 sheets of undefined wafers in the front storages FST1 and FST2. The undefined wafer may be a wafer on which the lot process is stopped due to a power failure or the like. Therefore, the front storages FST1 and FST2 can receive only 24 sheets of processed wafers. Accordingly, the controller 20 determines that all the 25 sheets of wafers in the FOUP LP2 cannot be accommodated in the front storage, i.e., the lot process cannot be started in the FOUP LP2.

In FIG. 4A, the lot process on 25 sheets of unprocessed wafers W are being performed along a transfer route passing through the FOUP LP1→the substrate processing chamber 102→the front storages FST1 and FST2→the FOUP LP1. Here, 16 sheets of wafers have already been unloaded from the FOUP LP1, and the 14th wafer is being plasma-processed, the 15th wafer is in a standby state in the load-lock chamber 104, and the 16th wafer is being aligned.

The lot process on 25 sheets of unprocessed wafers W are being performed along a transfer route passing through the FOUP LP2→the substrate processing chamber 106→the front storages FST1 and FST2→the FOUP LP2. Here, 21 sheets of wafers have already been unloaded from the FOUP LP2, and the 20th wafer is being plasma-processed and the 21st wafer is in a standby state in the load-lock chamber 104.

Accordingly, at this time, a total of 32 sheets (=13+19) of processed wafers are retreated to the front storages FST1 and FST2. In this state, in order to perform the plasma process on 25 sheets of unprocessed wafers W along a transfer path passing through the FOUP LP3→the substrate processing chamber 110→the front storages FST1 and FST2→the FOUP LP3, the controller 20 checks if the front storages FST1 and FST2 are in an available state. In this case, a total of 50 sheets of wafers including 25 sheets of wafers in the FOUP LP1 and 25 sheets of wafers in the FOUP LP2 are supposed to be retreated to the front storages FST1 and FST2. Accordingly, the controller 20 does not allow the lot process to be started but to be in a standby state until 25 sheets are started to be re-accommodated from the front storages FST1 and FST2 into the FOUP LP1 or until 25 sheets are started to be re-accommodated from the front storages FST1 and FST2 into the FOUP LP2.

While the lot start is in a standby state, the controller 20 displays the symbol 300 indicative of a standby state of the lot start on a display as depicted in the upper right corner of FIG. 4A until the lot start in the FOUP LP3 is allowed. The standby state can be displayed by flickering on and off the symbol 300 instead of displaying/non-displaying the symbol 300. For example, by flickering the symbol 300, a state just before a start of the standby state or an end of the standby state may be indicated. In addition to the symbol 300, a bar may be shown such that a length of the bar indicates a remaining standby time with respect to a total standby time.

Then, if the last unprocessed wafer in the FOUP LP1 is decided, the controller 20 controls the wafers accommodated in front storages FST1 and FST2 to be re-accommodated into the FOUP LP1. At the same time, the controller 20 determines that all the 25 sheets of wafers in the FOUP LP3 can be accommodated in the front storage, i.e., the lot process can be started in the FOUP LP3, and controls the wafers to be transferred from the FOUP LP3. Alternatively, after it is determined that there are 25 sheets or more available space in the front storages FST1 and FST2, the transfer of the wafers from the FOUP LP3 may be started.

Figure 4B:
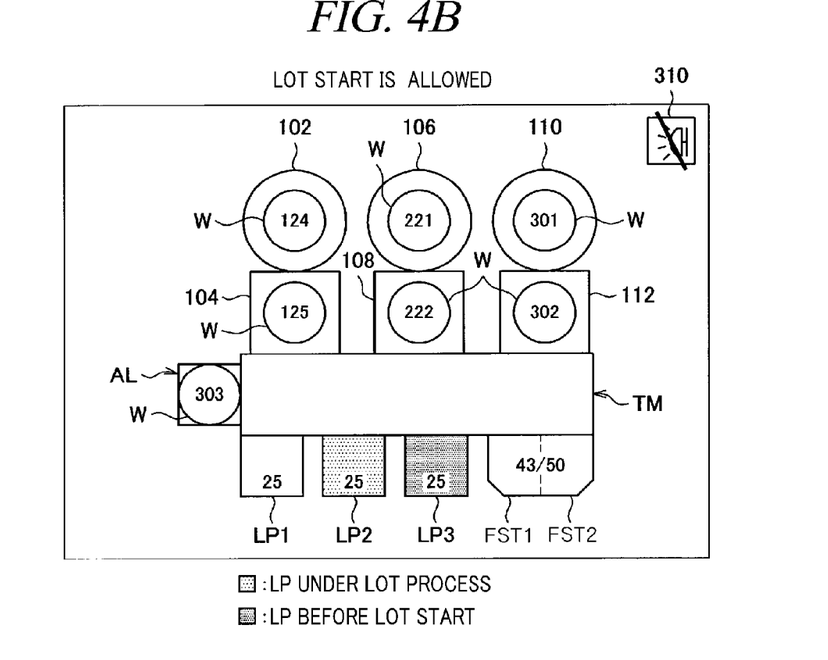

If the lot start is allowed in the FOUP LP3, the controller 20 displays a symbol 310 indicative of allowance of the lot start as depicted in the upper right corner of FIG. 4B. Alternatively, if the lot start is allowed in the FOUP LP3, it may be possible for the controller 20 not to display the symbol 300. Accordingly, the operator can monitor the progress of each lot process.

(3) Unloading Operation and Processing Operation

If it is determined that the wafers can be stored in the front storages FST1 and FST2 in the determination operation of an accommodation availability, the controller controls the plasma process (processing step) to be performed. For example, if a state of the FOUP LP3 is changed from a standby state of the lot start as shown in FIG. 4A to an allowance state of the lot start as shown in FIG. 4B, the controller 20 controls 25 sheets of wafers W in the FOUP LP3 to be transferred to the substrate processing chamber 110 in sequence and the wafers W are plasma-processed in this substrate processing chamber 110.

(4) Retreat Operation

After the plasma process, the controller 20 controls the processed wafers W to be transferred and retreated temporarily into the front storages FST1 and FST2 (retreat step).

(5) Determination Operation

The controller 20 checks the number of empty slots of the front storages FST1 and FST2. Here, the controller 20 determines whether the last unprocessed wafer is unloaded from the FOUP under lot-process (determination step).

Based on information of the last unprocessed wafer of each lot accommodated in the FOUP or information of a lot process stop, the controller 20 determines that the last unprocessed wafer is unloaded and performs re-accommodation into the FOUP as described below.

For example, in FIG. 4B, with respect to 25 sheets of wafers W accommodated in the FOUP LP1, the last wafer (wafer 125 in FIG. 4B) of the last lot is loaded into the load-lock chamber 104. When the wafer 125 is loaded into the load-lock chamber 104, the controller 20 determines that the last unprocessed wafer of the FOUP LP1 is decided.

Alternatively, the controller 20 may determine that the last unprocessed wafer is decided upon detecting the unloading of the last wafer of the last lot from the FOUP or the loading of the last wafer of the last lot into the substrate processing chamber.

Even if the lot process is stopped due to a power failure or the like, the controller 20 receives information on the lot process stop and determines that the last unprocessed wafer is decided and then performs re-accommodation into the FOUP as explained below.

(6) Re-Accommodation Operation

If it is determined that the unprocessed wafer decided as the last wafer is unloaded from any one of the FOUPs, the controller 20 controls a plurality of processed wafers, belonging to any one of the FOUPs and accommodated in the front storages FST1 and FST2, to be re-accommodated into their original FOUP by transferring them in sequence (accommodation step).

For example, in FIG. 4B, the controller 20 determines that the last wafer 225 among the 25 sheets of wafers W accommodated in the FOUP LP2 is unloaded. Therefore, the controller 20 controls the processed wafers W being accommodated in the front storages FST1 and FST2 among the 25 sheets of wafers W having been accommodated in the FOUP LP2 to be transferred into their original FOUP LP2. Accordingly, the number of empty slots in the front storages FST1 and FST2 increases, and, thus, it is possible to start the next lot process in a standby state.

In the same manner as the present embodiment, if there are three or more FOUPs and two front storages, until all the unprocessed wafers accommodated in any one of the two FOUPs are completely processed after the process on unprocessed wafers accommodated in two of the three or more FOUPs are started, unprocessed wafers accommodated in the other FOUP are in a standby state.

Further, if dummy wafers among a plurality of unprocessed wafers accommodated in the FOUP or the other storages are transferred to the substrate processing chamber, the controller 20 controls a plasma process to be performed and then the dummy wafers to be returned to their original FOUP or the other storages without temporarily retreating them to the front storages FST1 and FST2.

In accordance with the present embodiment, there are provided the front storages FST1 and FST2 each serving as a buffer for temporarily storing wafers in addition to the FOUPs LP1, LP2, and LP3. After the last unprocessed wafer is unloaded from the FOUP, a plurality of processed wafers accommodated in the front storage is transferred to and re-accommodated in their original FOUP in sequence.

Therefore, the unprocessed wafer and the processed wafer are completely isolated from each other and transferred in sequence, and, thus, it is possible to avoid co-existence thereof in the FOUP. Accordingly, it is possible to avoid a secondary contamination on the unprocessed wafer or the processed wafer, thereby preventing a decrease in production yield.

In the above-described embodiments, the operations of the respective units are correlated with each other and can be substituted by a series of operations in consideration of correlation therebetween. Therefore, the embodiment of the controller controlling the substrate processing system can be applied to an embodiment of a substrate receiving method.

There have been explained the embodiments of the present invention in detail with reference to the accompanying drawings, but it is clear that the above-described embodiments are illustrative in all aspects and do not limit the present invention. It would be understood by those skilled in the art that various changes and modifications may be made without changing technical conception and essential features described in the following claims and their equivalents are included in the scope of the present invention.

Figure 5:
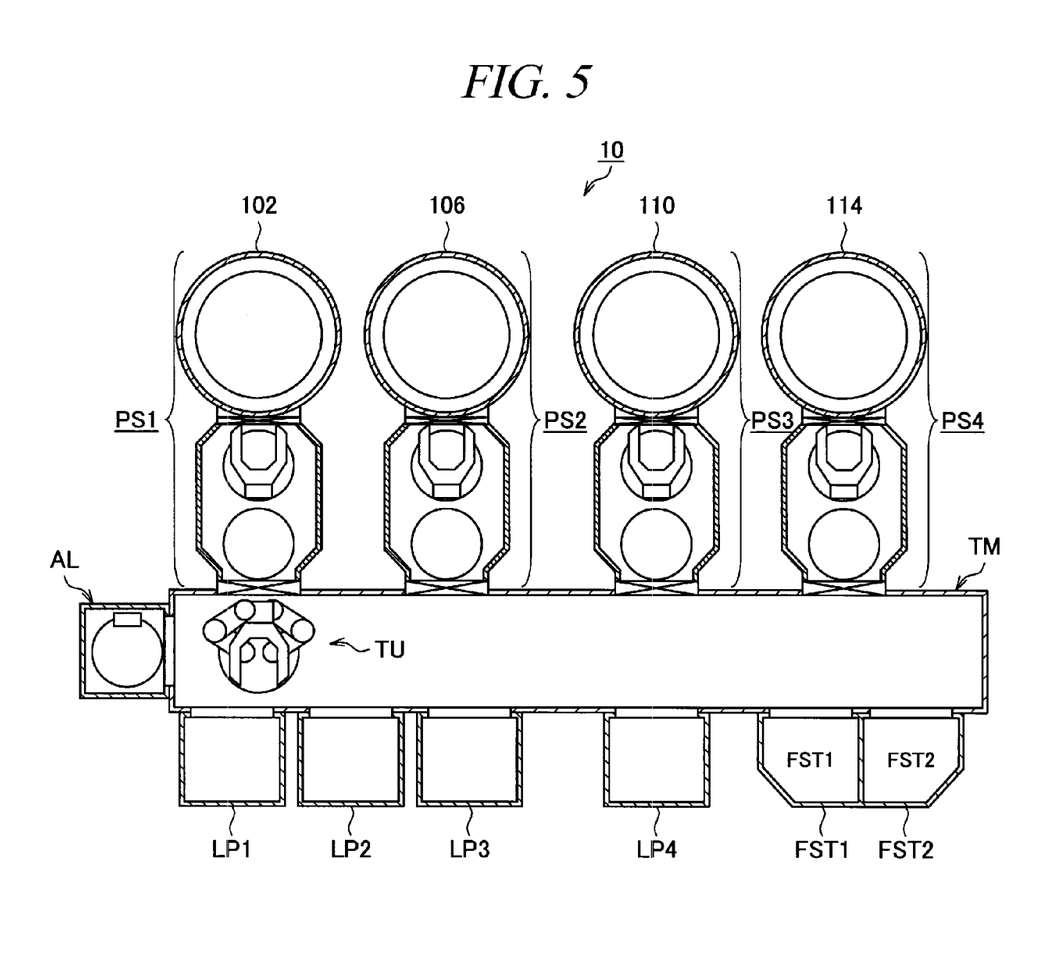
FIG. 5 is a view of a modified example of a substrate processing system in accordance with an embodiment of the present invention.

For example, in the above-described embodiments, the substrate processing system includes three FOUPs LP1 to LP3, three substrate processing chambers 102, 106, and 110, and two front storages FST1 and FST2. However, the present invention is not limited thereto. For example, the substrate processing system in accordance with the present invention may include four FOUPs LP1, LP2, LP3, and LP4, four substrate processing chambers 102, 106, 110, and 114, and two front storages FST1 and FST2. In this way, the number of FOUPs and front storages of the substrate processing system in accordance with the present invention can be decided in consideration of limitation on the arrangement.

Further, in the above-described embodiments, the processed dummy wafers are re-accommodated in their original FOUP without being retreated to the front storages. However, in the substrate processing system in accordance with the present invention, the dummy wafers may be retreated to the front storage in the same manner as the product wafers.

Furthermore, the target object to be processed in the substrate processing system in accordance with the present invention is not limited to a wafer, but includes a substrate.

What is claimed is:

1. A substrate receiving method in a substrate processing system including a substrate processing chamber in which a plasma process is performed on a substrate at a preset vacuum state, a load-lock chamber which is connected with the substrate processing chamber, at least one first substrate storage container and at least one second substrate storage container configured to accommodate substrates, and an atmospheric transfer chamber which connects the load-lock chamber and the at least one first and the at least one second substrate storage container, the method comprising:
   a checking process of checking whether or not an unprocessed substrate lacking an assigned lot number is accommodated in the at least one first substrate storage container and assigning a lot number to the unprocessed substrate lacking an assigned lot number until all of a plurality of unprocessed substrates accommodated in the at least one first substrate storage container have assigned lot numbers;
   a processing process of transferring the plurality of unprocessed substrates accommodated in the at least one first substrate storage container to the substrate processing chamber in sequence and performing a plasma process on the unprocessed substrates in the substrate processing chamber;
   a retreating process of retreating the plasma-processed substrates temporarily to the at least one second substrate storage container by transferring the plasma-processed substrates to the at least one second substrate storage container in sequence;
   a determining process of determining whether or not the last unprocessed substrate is unloaded from the at least one first substrate storage container; and
   a re-accommodating process of transferring and re-accommodating the plurality of the processed substrates accommodated in the at least one second substrate storage container into the at least one first substrate storage container in sequence when it is determined that the last unprocessed substrate is unloaded in the determining process.

2. The substrate receiving method of claim 1, further comprising:
   an availability determining process of determining whether or not it is possible to load all the unprocessed substrates accommodated in the at least one first substrate storage container into the at least one second substrate storage container based on an available state of the at least one second substrate storage container,
   wherein if it is determined in the availability determining process that it is possible to load the unprocessed substrates into the at least one second substrate storage container, the processing process is performed.

3. The substrate receiving method of claim 2, wherein in the availability determining process, if the number of the unprocessed substrates accommodated in the at least one first substrate storage container is equal to or smaller than the number of the processed substrates which can be loaded into the at least one second substrate storage container, it is determined that all the unprocessed substrates can be loaded into the at least one second substrate storage container.

4. The substrate receiving method of claim 3, wherein in the determining process, it is determined that the last unprocessed substrate is unloaded, based on information of the last unprocessed substrate accommodated in the at least one first substrate storage container for each lot or information of a lot process stop.

5. The substrate receiving method of claim 2, wherein in the determining process, it is determined that the last unprocessed substrate is unloaded, based on information of the last unprocessed substrate accommodated in the at least one first substrate storage container for each lot or information of a lot process stop.

6. The substrate receiving method of claim 1, wherein in the determining process, it is determined that the last unprocessed substrate is unloaded, based on information of the last unprocessed substrate accommodated in the at least one first substrate storage container for each lot or information of a lot process stop.

7. The substrate receiving method of claim 1, wherein if a dummy substrate is transferred to the substrate processing chamber, the dummy substrate is returned to the at least one first substrate storage container without being retreated temporarily to the at least one second substrate storage container in the retreating process after the processing process.

8. The substrate receiving method of claim 1, wherein the at least one first substrate storage container is plural in number and the at least one second substrate storage container is plural in number, and
   when the number of the first substrate storage containers is greater than the number of the second substrate storage containers, unprocessed substrates in one of the first substrate storage containers are not unloaded until the last unprocessed substrate in another of the first substrate storage containers is unloaded.

9. The substrate receiving method of claim 8, wherein after it is determined that the last unprocessed substrate in said another of the first substrate storage containers is unloaded, unloading of the unprocessed substrates accommodated in said one of the first substrate storage containers is started.

10. A controller which controls a substrate processing system including a substrate processing chamber in which a plasma process is performed on a substrate at a preset vacuum state, a load-lock chamber which is connected with the substrate processing chamber, at least one first substrate storage container and at least one second substrate storage container configured to accommodate substrates, and an atmospheric transfer chamber which connects the load-lock chamber and the at least one first and the at least one second substrate storage container, the controller performing a control of:
   checking whether or not an unprocessed substrate lacking an assigned lot number is accommodated in the at least one first substrate storage container and assigning a lot number to the unprocessed substrate lacking an assigned lot number until all of a plurality of unprocessed substrates accommodated in the at least one first substrate storage container have assigned lot numbers;
   transferring the plurality of unprocessed substrates accommodated in the at least one first substrate storage container to the substrate processing chamber in sequence and performing a plasma process on the unprocessed substrates in the substrate processing chamber;

retreating the plasma-processed substrates temporarily to the at least one second substrate storage container by transferring the plasma-processed substrates to the at least one second substrate storage container in sequence;

determining whether or not the last unprocessed substrate is unloaded from the at least one first substrate storage container; and transferring and re-accommodating the plurality of the processed substrates accommodated in the at least one second substrate storage container into the at least one first substrate storage container in sequence when it is determined that the last unprocessed substrate is unloaded as a result of the determining.

* * * * *

UNITED STATES PATENT AND TRADEMARK OFFICE
CERTIFICATE OF CORRECTION

| | |
|---|---|
| PATENT NO. | : 8,731,698 B2 |
| APPLICATION NO. | : 12/762426 |
| DATED | : May 20, 2014 |
| INVENTOR(S) | : Shinobu Onodera |

It is certified that error appears in the above-identified patent and that said Letters Patent is hereby corrected as shown below:

In the Specification

Column 9, line 28, please add - 20 - between "controller" and "controls"

Signed and Sealed this
Ninth Day of September, 2014

Michelle K. Lee
*Deputy Director of the United States Patent and Trademark Office*